United States Patent
Tu et al.

(10) Patent No.: US 7,609,189 B1
(45) Date of Patent: Oct. 27, 2009

(54) INTERFACE FOR HYBRID SIGMA-DELTA DATA CONVERTER

(75) Inventors: Cao-Thong Tu, Lausanne (CH); Heinz Maeder, Weinfelden (CH)

(73) Assignee: Marvell International Ltd. (BM)

( * ) Notice: Subject to any disclaimer, the term of this patent is extended or adjusted under 35 U.S.C. 154(b) by 0 days.

(21) Appl. No.: 12/106,902

(22) Filed: Apr. 21, 2008

Related U.S. Application Data

(60) Provisional application No. 60/912,795, filed on Apr. 19, 2007.

(51) Int. Cl.
*H03M 3/00* (2006.01)

(52) U.S. Cl. ...................... 341/143; 341/155

(58) Field of Classification Search ............... 341/143, 341/155
See application file for complete search history.

(56) References Cited

U.S. PATENT DOCUMENTS

| | | | |
|---|---|---|---|
| 5,079,550 A * | 1/1992 | Sooch et al. | 341/143 |
| 6,121,909 A * | 9/2000 | Lee et al. | 341/143 |
| 7,042,377 B2 * | 5/2006 | Oliaei | 341/143 |
| 7,095,345 B2 * | 8/2006 | Nguyen et al. | 341/120 |
| 7,227,481 B2 * | 6/2007 | del Mar Chamarro Marti et al. | 341/143 |
| 7,495,593 B2 * | 2/2009 | Wang | 341/143 |

OTHER PUBLICATIONS

Khiem Nguyen et al. "A 106-dB SNR Hybrid Oversampling Analog-to-Digital Converter for Digital Audio", IEEE Journal of Solid-State Circuits, vol. 40, No. 12, Dec. 2005, 8 pgs.
Paul Morrow et al. "A 0.18μm 102dB-SNR Mixed CT SC Audio-Band ΔΣ ADC", 2005 IEEE International Solid-State Circuits Conference, 3 pgs.

\* cited by examiner

*Primary Examiner*—Khai M Nguyen

(57) ABSTRACT

A hybrid sigma-delta converter that includes a continuous-time circuit that processes an input signal and generates a first output signal, an interface circuit that receives the first output signal from the continuous-time circuit and filters the first output signal thereby generating a second output signal, and a discrete-time circuit that processes the second output signal received from the interface circuit. The interface circuit further reduces the coupling of noise generated from the operation of the discrete time circuit to the preceding continuous-time circuit.

18 Claims, 5 Drawing Sheets

INTERFACE FOR HYBRID SIGMA-DELTA DATA CONVERTER

RELATED APPLICATION

This application claims the benefit of U.S. Provisional Application No. 60/912,795, filed on Apr. 19, 2007, which is incorporated herein by reference.

BACKGROUND

1. Technical Field

The present disclosure relates generally to hybrid sigma-delta converters and, more particularly, to efficient hybrid sigma-delta converters.

2. Related Art

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Applications involving signal processing such as modern communication systems require high accuracy (e.g. 12-14 bit) and high speed (e.g. tens of Megahertz) analog-to-digital converters (ADCs) and/or digital-to-analog converters (DACs). Sigma-delta modulation is a technique used in over-sampling converters in order to achieve high resolution and low distortion. Sigma-delta converters can be implemented using continuous-time circuitry and/or discrete-time circuitry. Sigma-delta converters utilizing a combination of continuous and discrete-time circuitry are known as hybrid sigma-delta converters.

Referring now to FIG. 1, an exemplary hybrid sigma-delta ADC 10 is shown to include a summer 12, a loop filter module 14, a quantization module 16, a first feedback DAC 18, and a second feedback DAC 19. The summer 12 receives and sums an analog input signal transmitted from an external device (not shown) with an output of the DAC 18. The loop filter module 14 receives an output signal (i.e., the summed input) of the summer 12.

The loop filter module 14 of the hybrid sigma-delta ADC 10 includes a continuous-time (CT) integration circuit 20, a discrete-time (DT) integration circuit 22, and a summer 23. The CT integration circuit 20 and the DT integration circuit 22 each typically comprise one or more continuous-time integrator circuits and one or more discrete-time integrator circuits. The CT integration circuit 20 processes the analog input signal. The summer 23 receives and sums the analog output signal of the CT integration circuit 20 with the output of the second feedback DAC 19. The output of the summer 23 is converted to a discrete-time signal and further processed by the DT integration circuit 22.

The output of the DT integration circuit 22 (i.e., the output of the loop filter module 14) is communicated to the quantization module 16. In various embodiments, the quantization module 16 may include a one bit ADC, though other types of quantization circuitry are contemplated. The output of the quantization module 16 forms the output data of the hybrid sigma-delta ADC 10. Additionally, the quantization module 16 communicates the output data to the first feedback DAC 18 which then converts the output data to an analog signal. The first feedback DAC 18 transmits the analog signal to the summer 12. The output of the quantization module 16 is also transmitted to the second feedback DAC 19.

Through the combination of CT input stages and DT filters, hybrid sigma-delta ADCs are able to precisely "shape" noise (e.g. quantization noise) generated during processing of the input signal. Additionally, hybrid sigma-delta ADCs feature superior anti-alias characteristics based in-part on the CT filter stages which often lessen the need of other anti-alias filters is specific applications. However, the DT filter incorporated within a hybrid sigma-delta ADC includes an intrinsic sample-and-hold (S/H) stage which can impose differential and common mode stress on the preceding CT stage within the hybrid sigma-delta ADC thereby causing a degradation of the overall Signal to Noise and Distortion Ratio (SNDR) performances of the hybrid sigma-delta ADC.

BRIEF SUMMARY

The present disclosure is defined by the following claims, and nothing in this section should be taken as a limitation on those claims.

By way of introduction, the preferred embodiments below provide a hybrid sigma-delta converter that includes a continuous-time circuit that processes an input signal and generates a first output signal, an interface circuit that receives the first output signal from the continuous-time circuit and filters the first output signal thereby generating a second output signal, and a discrete-time circuit that processes the second output signal received from the interface circuit. The interface circuit further reduces the coupling of noise generated from the operation of the discrete-time circuit to the preceding continuous-time circuit.

Other systems, methods, and features of the invention will be, or will become, apparent to one with skill in the art upon examination of the following figures and detailed description. It is intended that all such additional systems, methods, features and advantages be included within this description, be within the scope of the invention, and be protected by the following claims.

The preferred embodiments will now be described with reference to the attached drawings.

DETAILED DESCRIPTION OF THE PRESENTLY PREFERRED EMBODIMENTS

The disclosure can be better understood with reference to the following drawings and description. The components in the figures are not necessarily to scale, emphasis instead being placed upon illustrating the principles of the invention. Moreover, in the figures, like referenced numerals designate corresponding parts or elements throughout the different views. The following description is merely exemplary in nature and is in no way intended to limit the disclosure, its application, or uses. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

By way of introduction, the embodiments described herein are related to hybrid sigma-delta converters. Hybrid sigma-delta converters use continuous-time (CT) input stages and discrete-time (DT) filters to generate a desired noise-shaping of an input signal. A hybrid sigma-delta configuration allows for intrinsic anti-aliasing provided by the CT input stage which can supplement a preceding anti-alias filter that processes the input signal. However, the DT filter of the hybrid sigma-delta configuration includes an intrinsic sample-and-hold (S/H) stage which generates "kickback" signals (i.e., discrete-time loading) that interferes with the performance of the CT input stage. As such, conventional hybrid sigma-delta converters compensate for performance degradation caused by the interface between the CT input stage and the DT filter by introducing an active inter-stage buffer such as a differential amplifier or a linearized source follower between the CT input stage and the DT filter. Embodiments of a hybrid sigma-delta converter incorporating an active inter-stage buffer however consume substantial levels of current to meet linearity requirements. Interstage buffers built of linearized source followers are generally not compatible with low voltage operations due to the fact that the inter-stage buffer reduces the available output voltage swing. The present disclosure describes an interface system that provides inter-stage filtering between a continuous-time stage and a discrete-time stage of a hybrid sigma-delta converter that absorbs both differential and common mode stress imposed by the discrete-time stage, limits peak currents, and rejects clock injection "kick backed" to the continuous-time stage.

Figure 1:
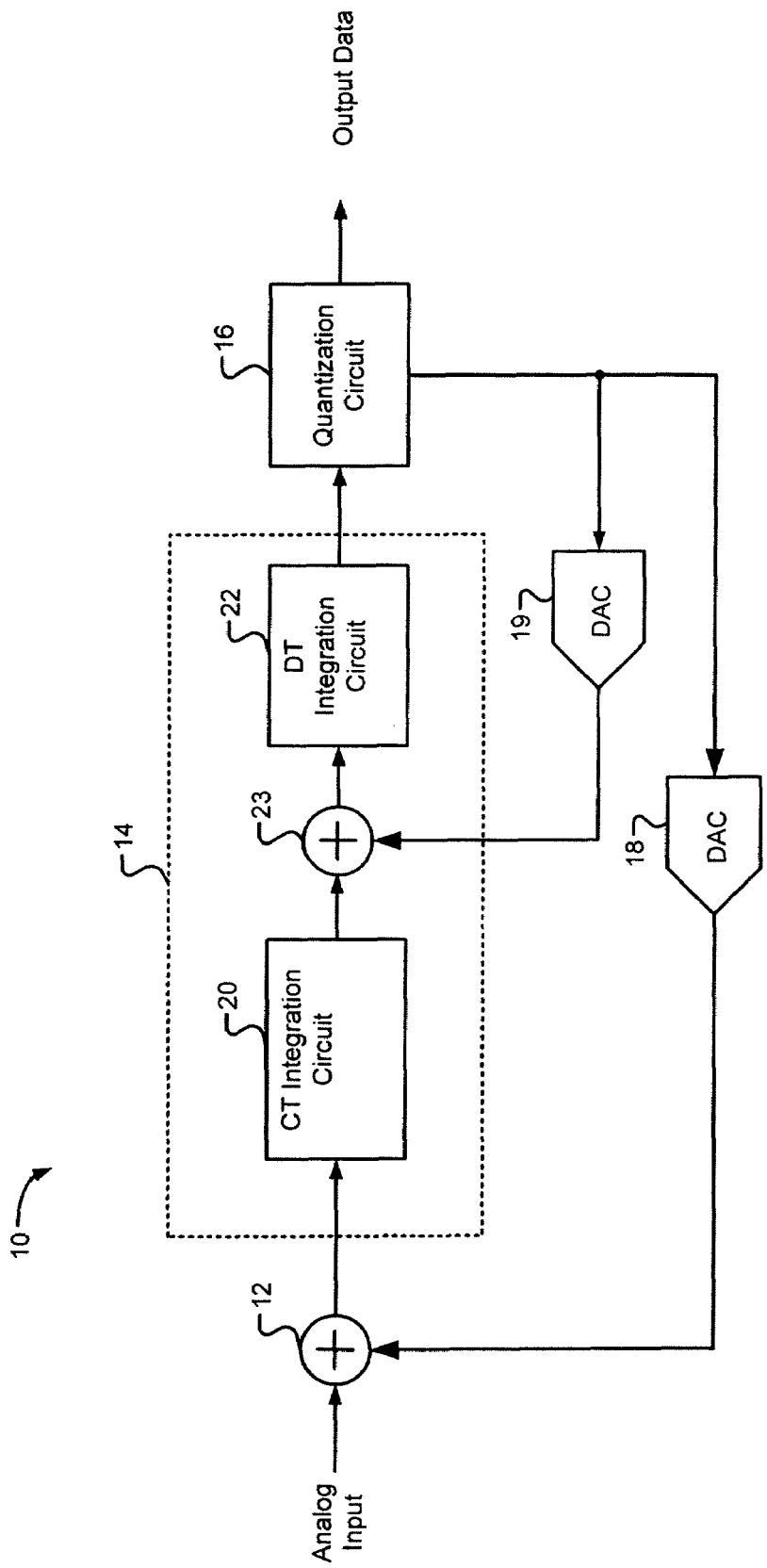
FIG. 1 is a functional block diagram of an exemplary hybrid sigma-delta analog-to-digital converter according to the prior art.
Figure 2:
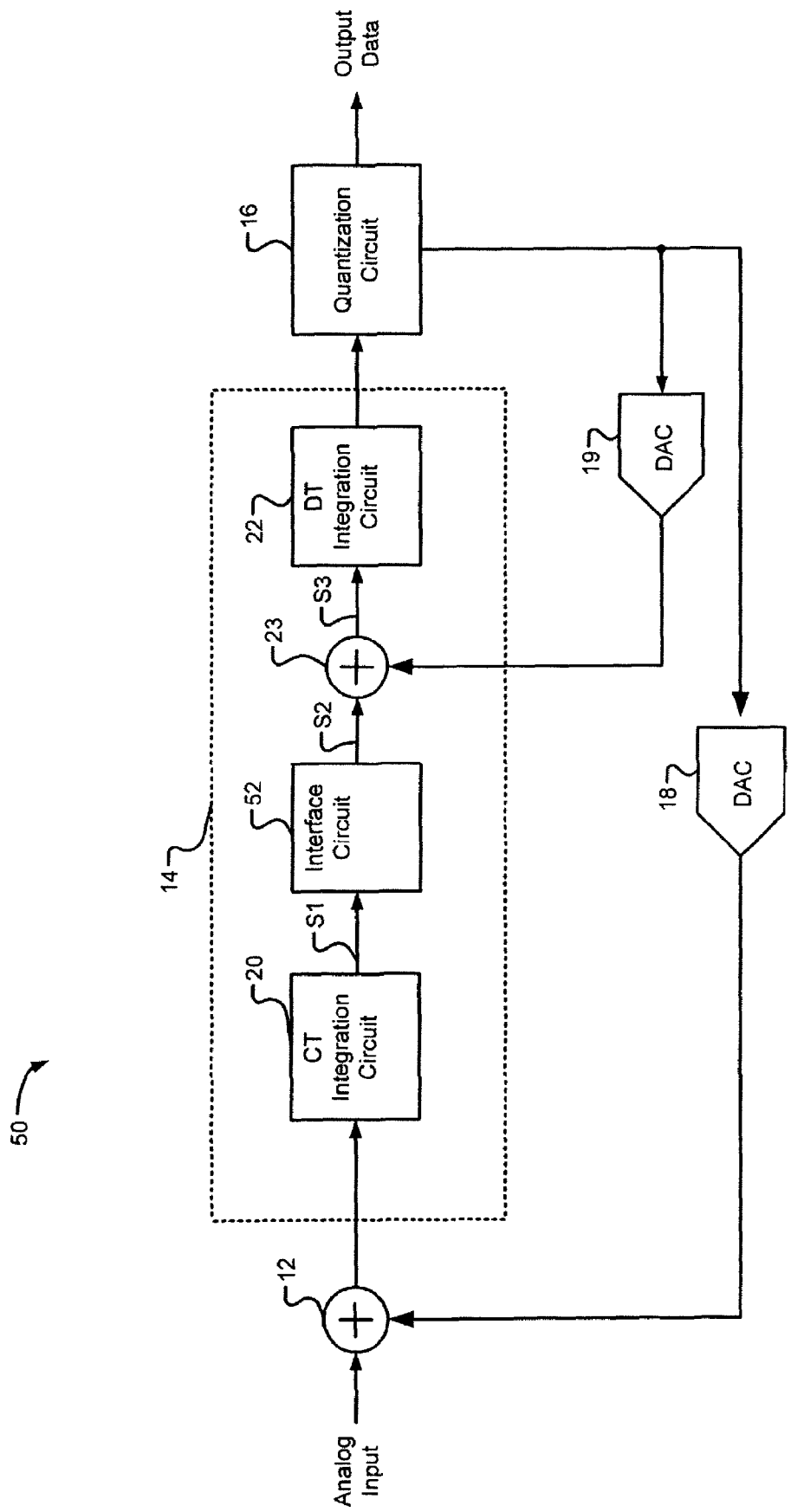
FIG. 2 is a functional block diagram of an exemplary hybrid sigma-delta analog-to-digital converter (ADC) according to the present disclosure.

Referring now to FIG. 2, an exemplary hybrid sigma-delta ADC 50 is illustrated. The exemplary hybrid sigma-delta ADC 50 may implement an interface system by including an interface circuit 52. In the present implementation the interface circuit 52 is realized with a passive network of elements (e.g., a resistor-capacitor (RC) network) though other embodiments are contemplated. The passive RC network will be described in more detail below. By utilizing a passive RC network, the interface circuit 52 operates as a bi-directional low-pass filter to reduce the amount of current drawn from the CT input stage during sampling operations and to overcome the performance degradation associated with interface between CT integration circuit 20 and the DT integration circuit 22.

In the present embodiment, the CT integration circuit 20 processes the signal received from the summer 12 (e.g., the analog input signal and the output signal from the first feedback DAC 18) and transmits a first output signal S1 to the interface circuit 52. The interface circuit 52 performs filtering operations on the first output signal S1, thereby generating a second output signal S2. The summer 23 receives and sums the second output signal S2 with the output of the second feedback DAC 19, thereby generating a third output signal S3. The DT integration circuit 22 receives the third output signal S3 for further processing.

Figure 3:
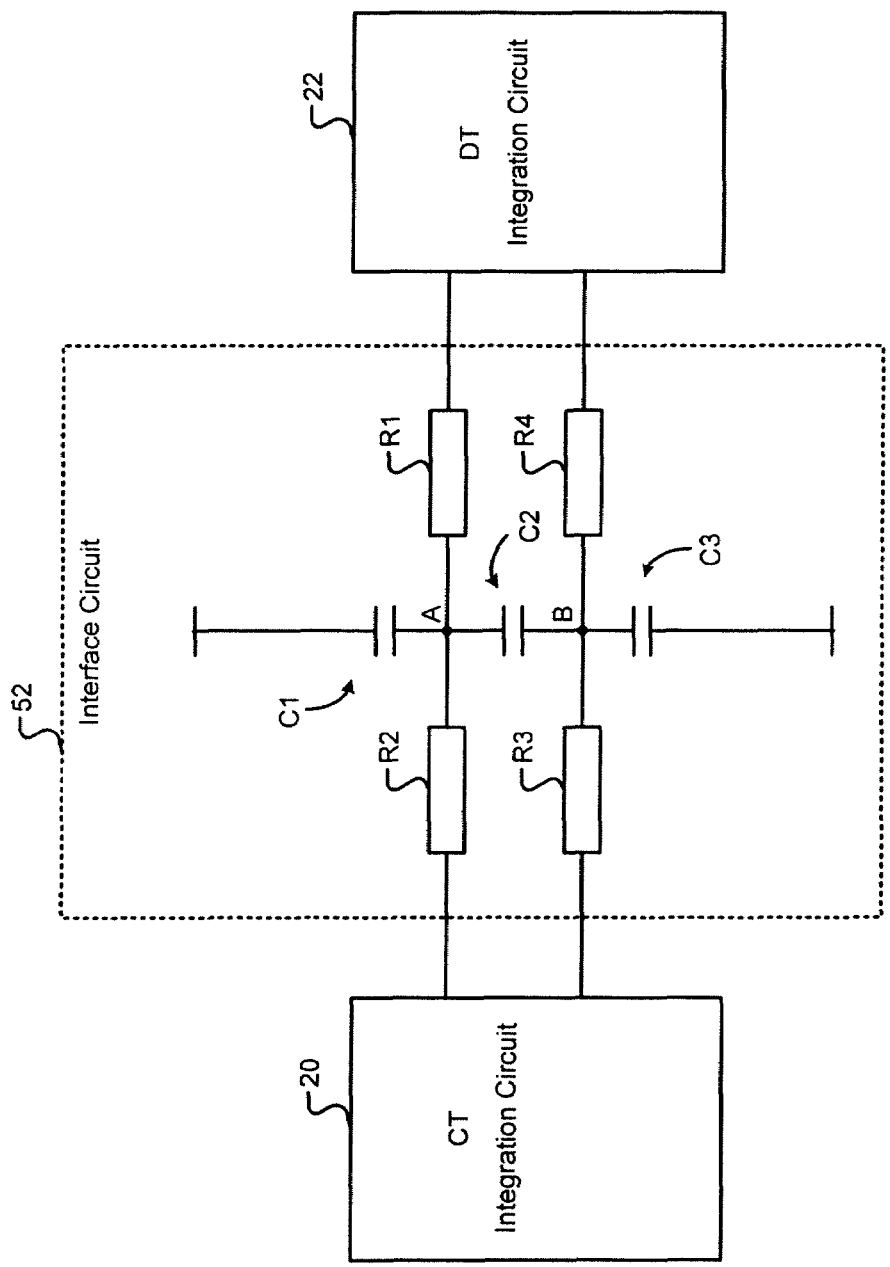
FIG. 3 is a functional block diagram of an interface circuit according to the present disclosure.

Referring now to FIG. 3, an exemplary implementation of the interface circuit 52 is shown in more detail. As previously mentioned, the interface circuit 52 implements the interface system of the present disclosure. The interface circuit 52 includes resistors R1, R2, R3, and R4, referred to collectively as the resistors, and capacitors C1, C2, and C3, referred to collectively as the capacitors. Respective first sides of the capacitors C1 and C2 and respective first ends of the resistors R1 and R2 are coupled to each other at a common node A. A second side of capacitor C2, a first side of capacitor C3, and respective first ends of resistors R3 and R4 are coupled to each other at a common node B. Second ends of both resistors R2 and R3 are coupled to the CT integration circuit 20 and second ends of both resistors R1 and R4 are coupled to the DT integration circuit 22. In the present implementation, the interface circuit 52 is configured as a T-network arrangement, though the present disclosure contemplates other arrangements such as a Pi-network.

During operation of the exemplary hybrid sigma-delta converter 50, an input signal is communicated from the CT integration circuit 20 to the DT integration circuit 22 via the interface circuit 52. As previously noted, the interface circuit 52 operates as a bidirectional low-pass filter. In other words, the interface circuit 52 serves to attenuate the coupling of a high frequency component of the sampled input signal of the DT integration circuit 22 to the input of the CT integration circuit 20. Typically, the sigma-delta converters are primarily concerned with passing a low frequency component of a sampled input signal. For example, the present implementation anticipates passing a low frequency component having a threshold of approximately 1 MHz based within a frequency band having a bandwidth in the range of tens of kHzs. Furthermore the clock rate of operating the hybrid sigma-delta ADC 50 is directly correlated to a desired bandwidth that is to be passed by the interface circuit 52. Namely, the greater the desired operating bandwidth, the greater the operating clock rate of the sigma-delta converter. In other words, the parameter values of the interface circuit 52 can be selected based on the frequency requirements of a particular application.

As previously mentioned, the operation of the DT integration circuit 22 on the sampled input signal generates high frequency noise (i.e., "kickback" signals) such as voltage spikes, and/or current spikes reflected from output of the interface circuit 52 towards the CT integration circuit 20. Sources of the high frequency noise include, but are not limited to, clock injection from various clocks (not shown) the intrinsic sample-and-hold operations of the DT integration circuit 22 as well as the second feedback DAC 19. The interface circuit 52 operates to reduce the magnitude of the kick back signals (e.g., high frequency perturbation) reflected back towards the CT integration circuit 20. For example, in the present implementation the second end of the resistor R1 receives the kickback signal reflected from the DT integration circuit 22 and serves to reduce the impedance of the kickback signal. The kickback signal at node A (i.e., the first end of the resistor R1) can be transmitted across the resistor R2 or alternatively can be transmitted to ground via the capacitor C1.

However, since at high frequencies, the capacitor C1 represents a lower impedance alternative relative to the path containing the resistor R2, the kickback signal inherently follows the path of least resistance across the capacitor C1 (i.e., a shunt to a ground potential). Those skilled in the art will appreciate that the combination of resistors R3 and R4 and capacitor C3 operates to reduce the magnitude of the kick back signals in similar fashion during operation of the exemplary hybrid sigma-delta ADC 50. The capacitor C2 positioned between node A and node B serves to attenuate differential mode stress generated by the DT integration circuit 22 and thus appears transparent during common mode stress events as described above.

Figure 4A:
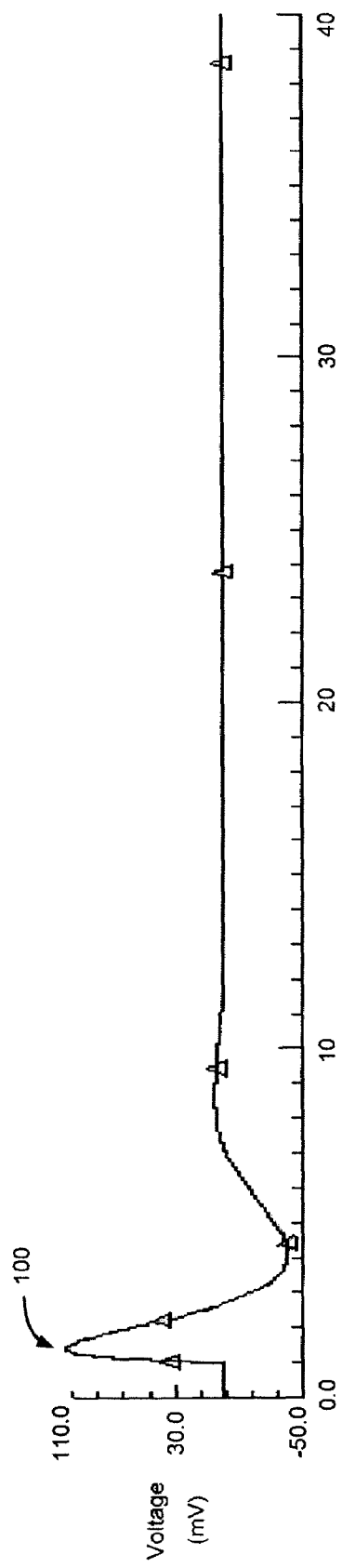
FIG. 4(a) is a graph illustrating an exemplary timing diagram of the output voltage of a continuous-time integration circuit of the exemplary hybrid sigma-delta ADC according to the prior art.
Figure 4B:
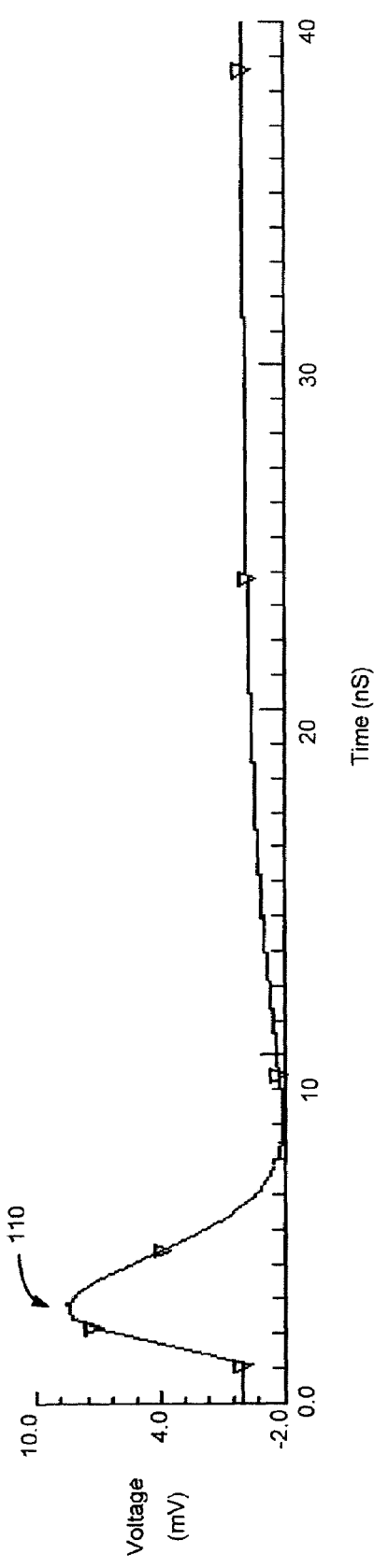
FIG. 4(b) is a graph illustrating an exemplary timing diagram of the output voltage a continuous-time integration circuit of the exemplary hybrid sigma-delta ADC according to the present disclosure.

Referring now to FIGS. 4(a) and 4(b), exemplary simulation results are shown for the output voltages of a CT integration circuit of a conventional hybrid sigma-delta ADC according to the prior art and the exemplary hybrid sigma-delta ADC 50 according to the present disclosure, respectively. FIG. 4(a) illustrates a timing diagram that includes a voltage spike 100 approximately equal to 100 millivolts (mV). The voltage spike 100, may drive the output into a saturation region, thereby adversely effecting the gain which results in non-ideal operation of the CT integration circuit. As previously mentioned, active inter-stage buffers between a CT integration circuit and a DT integration circuit can be used to isolate the CT integration circuit from the output voltage stress due to the large voltage spikes (e.g., voltage spike 100) at the output of the CT integration circuit. As depicted in FIG. 4(b), the timing diagrams of the CT integration circuit 20 of the exemplary hybrid sigma-delta ADC 50 includes a greatly reduced voltage spike 110 to approximately 10 mVs based on proper sizing of the filtering elements.

Figure 5A:
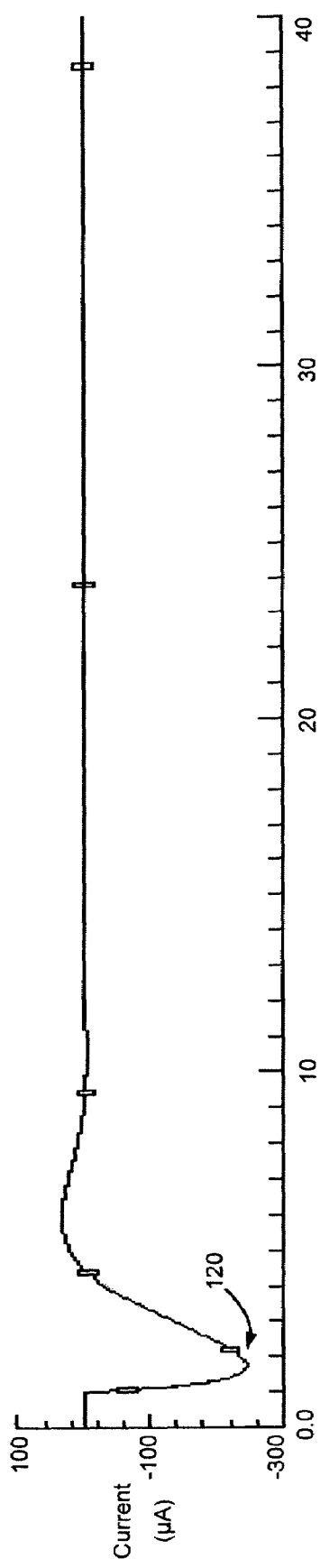
FIG. 5(a) is a graph illustrating an exemplary timing diagram of the current stress on the output of the continuous-time integration circuit of the exemplary hybrid sigma-delta ADC according to the prior art.
Figure 5B:
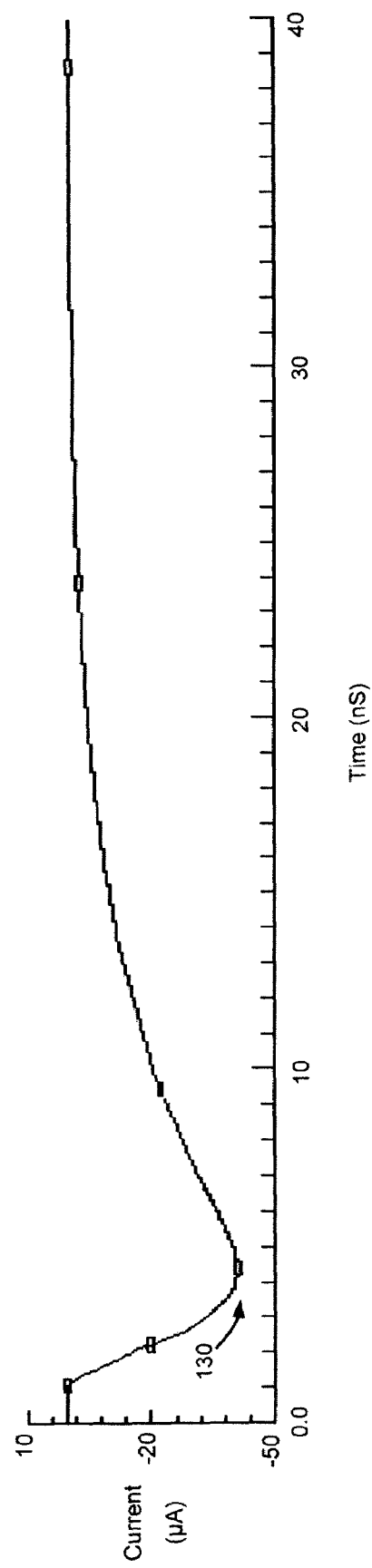
FIG. 5(b) is a graph illustrating an exemplary timing diagram of the current stress on the output of the continuous-time integration circuit of the exemplary hybrid sigma-delta ADC according to the present disclosure.

Referring now to FIGS. 5(a) and 5(b), exemplary simulation results are shown that depict the current stress on the output of a CT integration circuit of a conventional hybrid sigma-delta ADC according to the prior art and the exemplary hybrid sigma-delta ADC 50 according to the present disclosure, respectively. FIG. 5(a) illustrates a timing diagram that corresponds to the voltage stress observed in FIG. 4(a) which includes a current spike 120 approximately equal to 280 microamperes ($\mu$A). Current spikes result from common and/or differential kickback signals reflected back from a DT integration circuit. Large current spikes (e.g., current spike 120) can pull a CT integration circuit out of linear operation. A CT integration circuit typically should be able to accommodate a current spike value in addition to a current value required for normal operation, thereby resulting in a large current consumption by the CT integration circuit. In the present example, an output stage of the CT integration circuit would require approximately 400 $\mu$A to ensure both stability and linear operation resulting in inefficient current usage of the CT integration circuit. FIG. 5(b) illustrates a timing diagram that corresponds to the voltage stress observed in FIG. 4(b). As depicted in FIG. 5(b), simulated current stress on output of the CT integration circuit 20 of the exemplary hybrid sigma-delta ADC 50, which incorporates the interface circuit 52, shows attenuation of current spike 130 of approximately 50 microamperes ($\mu$A). In the current example, the CT integration circuit 20 would require approximately 80 $\mu$A to ensure both stability and linear operation thereby resulting in a superior current efficiency.

All of the discussion above, regardless of the particular implementation being described, is exemplary in nature, rather than limiting. Although specific components of the interface system are described, methods, systems, and articles of manufacture consistent with the interface system may include additional or different components. For example, components of the interface system may be implemented by one or more of: control logic, hardware, a microprocessor, microcontroller, application specific integrated circuit (ASIC), discrete logic, or a combination of circuits and/or logic. Further, although selected aspects, features, or components of the implementations are depicted as hardware or software, all or part of the systems and methods consistent with the interface system may be stored on, distributed across, or read from machine-readable media, for example, secondary storage devices such as hard disks, floppy disks, and CD-ROMs; a signal received from a network; or other forms of ROM or RAM either currently known or later developed. Any act or combination of acts may be stored as instructions in computer readable storage medium. Memories may be DRAM, SRAM, Flash or any other type of memory. Programs may be parts of a single program, separate programs, or distributed across several memories and processors.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs and rule sets may be parts of a single program or rule set, separate programs or rule sets, or distributed across several memories and processors.

It is intended that the foregoing detailed description be understood as an illustration of selected forms that the invention can take and not as a definition of the invention. It is only the following claims, including all equivalents, that are intended to define the scope of this invention.

What is claimed is:

1. A hybrid sigma-delta converter, comprising:
   a continuous-time (CT) circuit that processes an input signal and generates a first output signal;
   an interface circuit that receives the first output signal from the CT circuit and filters the first output signal thereby generating a second output signal; and
   a discrete-time (DT) circuit that processes the second output signal received from the interface circuit,
   wherein the interface circuit further filters noise generated from operation of the DT circuit.

2. The converter of claim 1 wherein the noise includes high frequency perturbation.

3. The converter of claim 1 wherein the interface circuit includes a low-pass filter.

4. The converter of claim 1 wherein the interface circuit includes a network of passive elements.

5. The converter of claim 1 wherein the interface circuit is configured as a T-network.

6. The converter of claim 1 wherein the interface circuit includes a bi-directional low-pass filter.

7. A method of operating a hybrid sigma-delta converter, comprising:
   performing continuous-time processing on a sampled input signal and generating a first output signal;
   filtering the first output signal to generate a second output signal;
   performing discrete-time processing on the second output signal; and
   filtering noise generated by the discrete-time processing of the second output signal.

8. The method of claim 7 wherein the noise includes high frequency perturbation.

9. The method of claim 7 further comprising performing low-pass filtering.

10. The method of claim 7 further comprising filtering the first output signal with a network of passive elements.

11. The method of claim 10 further comprising configuring the network of passive elements as a T-network.

12. The method of claim 7 further comprising performing bi-directional low-pass filtering.

13. A hybrid sigma-delta converter, comprising:
  continuous-time (CT) means for processing an input signal and for generating a first output signal;
  interface means for receiving the first output signal from the CT means and for filtering the first output signal thereby generating a second output signal; and
  discrete-time (DT) means for processing the second output signal received from the interface means,
  wherein the interface means further filters noise generated from operation of the DT means.

14. The converter of claim 13 wherein the noise includes high frequency perturbation.

15. The converter of claim 13 wherein the interface means includes a low-pass filter.

16. The converter of claim 13 wherein the interface means includes a network of passive elements.

17. The converter of claim 13 wherein the interface means is configured as a T-network.

18. The converter of claim 13 wherein the interface means includes a bi-directional low-pass filter.

* * * * *